(12) United States Patent
Zhang

(10) Patent No.: US 10,672,316 B2
(45) Date of Patent: Jun. 2, 2020

(54) COF CIRCUIT BOARD, DISPLAY DEVICE, SIGNAL PROCESSING METHOD AND BRIDGING CHIP

(71) Applicants: BOE Technology Group Co., Ltd., Beijing (CN); Hefei BOE Optoelectronics Technology Co., Ltd., Hefei (CN)

(72) Inventor: Douqing Zhang, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/993,860

(22) Filed: May 31, 2018

(65) Prior Publication Data

US 2019/0180665 A1 Jun. 13, 2019

(30) Foreign Application Priority Data

Dec. 13, 2017 (CN) .......................... 2017 1 1326873

(51) Int. Cl.
*G09G 3/20* (2006.01)
*G06F 3/147* (2006.01)
(Continued)

(52) U.S. Cl.
CPC ........... *G09G 3/20* (2013.01); *G02F 1/13452* (2013.01); *G06F 3/147* (2013.01); *H05K 1/189* (2013.01); *G09G 2380/02* (2013.01)

(58) Field of Classification Search
CPC ....... G09G 3/20; G02F 1/13452; H05K 1/189
See application file for complete search history.

(56) References Cited

U.S. PATENT DOCUMENTS

2011/0271038 A1* 11/2011 Ferrario ............... G11C 7/1051
711/103
2016/0026047 A1 1/2016 Chen
(Continued)

FOREIGN PATENT DOCUMENTS

CN 103149388 A 6/2013
CN 104076544 A 10/2014
(Continued)

OTHER PUBLICATIONS

First office action of Chinese application No. 201711326873.1 dated Jan. 2, 2020.

*Primary Examiner* — Kevin M Nguyen
(74) *Attorney, Agent, or Firm* — Fay Sharpe LLP

(57) ABSTRACT

A COF circuit board, a display device, a signal processing method and a bridging chip are provided. The COF circuit board includes: a flexible circuit board, a driver integrated circuit and a bridging chip disposed on the flexible circuit board, wherein the flexible circuit board is further provided with a first connecting terminal and a second connecting terminal. An output end of the driver integrated circuit is electrically connected to the first connecting terminal. The bridging chip includes N first registers, M second registers and a controller, wherein the N first registers are electrically connected to an input end of the driver integrated circuit, the M second registers are electrically connected to the second connecting terminal, the controller is configured to write values in the M second registers into the corresponding N first registers according to a register corresponding relationship.

17 Claims, 2 Drawing Sheets

(51) Int. Cl.
    *H05K 1/18*     (2006.01)
    *G02F 1/1345*     (2006.01)

(56) References Cited

U.S. PATENT DOCUMENTS

| | | | |
|---|---|---|---|
| 2016/0188423 A1 | 6/2016 | Meaney et al. | |
| 2017/0196080 A1 | 7/2017 | Meng et al. | |
| 2017/0229060 A1* | 8/2017 | Sakamaki | G09G 3/2096 |
| 2018/0174509 A1* | 6/2018 | Kaehler | G09G 3/3225 |

FOREIGN PATENT DOCUMENTS

| | | |
|---|---|---|
| CN | 105447254 A | 3/2016 |
| CN | 105632382 A | 6/2016 |
| CN | 105680988 A | 6/2016 |

\* cited by examiner

COF CIRCUIT BOARD, DISPLAY DEVICE, SIGNAL PROCESSING METHOD AND BRIDGING CHIP

CROSS-REFERENCE TO RELATED APPLICATION

This application claims priority to Chinese Patent Application No. 201711326873.1, filed with the State Intellectual Property Office on Dec. 13, 2017 and titled "COF CIRCUIT BOARD, DISPLAY DEVICE AND SIGNAL PROCESSING METHOD," the entire contents of which are incorporated herein by reference.

TECHNICAL FIELD

The present disclosure relates to a COF circuit board, display device, signal processing method and bridging chip.

BACKGROUND

The chip on film (COF) technology is a crystal grain flexible film packaging technology of fixing a driver integrated circuit (Driver IC) on a flexible circuit board.

By taking the assembly of a liquid crystal display (LCD) panel as an example, in the LCD panel adopting the COF technology, the flexible circuit board (for example, a flexible printed circuit film (FPCF)) is bonded on the LCD as a carrier, while the driver IC is bonded on the flexible circuit board.

SUMMARY

Some embodiments of the present disclosure provide a COF circuit board, display device, signal processing method and bridging chip.

In a first aspect, there is provided a COF circuit board in an embodiment of the present disclosure. The COF circuit board comprises: a flexible circuit board, a driver integrated circuit and a bridging chip, wherein the driver integrated circuit and the bridging chip are disposed on the flexible circuit board, the flexible circuit board is provided with a first connecting terminal configured to be connected to a display panel and a second connecting terminal configured to be connected to a device main board, and an output end of the driver integrated circuit is electrically connected to the first connecting terminal; and the bridging chip comprises N first registers, M second registers and a controller, wherein the N first registers are electrically connected to an input end of the driver integrated circuit, the M second registers are electrically connected to the second connecting terminal, the controller is configured to obtain a register corresponding relationship and write values in the M second registers into the corresponding N first registers according to the register corresponding relationship, the register corresponding relationship comprises a corresponding relationship between the N first registers and the M second registers, and M and N are both positive integers.

In an implementation of the embodiment of the present disclosure, the bridging chip further comprises a timing sequence control line, wherein the timing sequence control line is configured to obtain a timing sequence control signal, and the controller is configured to determine the corresponding relationship between the N first registers and the M second registers according to the timing sequence control signal.

In another implementation of the embodiment of the present disclosure, the timing sequence control signal is an inter-integrated circuit (I2C) bus signal.

Optionally, the corresponding relationship between the N first registers and the M second registers is the corresponding relationship between the N first registers and at least a part of the M second registers.

Optionally, in the register corresponding relationship, each of the M second registers corresponds to at least one of the N first registers.

In another implementation of the embodiment of the present disclosure, the second connecting terminal is a zero insert force (ZIF) pluggable terminal.

In still yet another implementation of the embodiment of the present disclosure, the M is larger than or equal to the amount of connecting pins of the device main board.

In still yet another implementation of the embodiment of the present disclosure, the input end of the driver integrated circuit comprises N input terminals and the N input terminals and the N first registers are correspondingly connected one to one.

In a second aspect, there is provided a display device in an embodiment of the present disclosure. The display device includes any of the COF circuit boards described in the first aspect.

In a third aspect, there is provided a signal processing method in an embodiment of the present disclosure. The method applies to the display device described in the second aspect. The method comprises: obtaining a register corresponding relationship, wherein the register corresponding relationship comprises a corresponding relationship between N first registers and M second registers, and M and N are both positive integers; and writing values in the M second registers into the corresponding N first registers according to the register corresponding relationship.

In an implementation of the embodiment of the present disclosure, obtaining the register corresponding relationship comprises: obtaining a timing sequence control signal; and determining the corresponding relationship between the N first registers and the M second registers according to the timing sequence control signal.

In another implementation of the embodiment of the present disclosure, the timing sequence control signal is an I2C bus signal.

In yet another implementation of the embodiment of the present disclosure, determining the corresponding relationship between the N first registers and the M second registers according to the timing sequence control signal comprises: obtaining a corresponding relationship between an index value and a preset corresponding relationship, wherein the preset corresponding relationship comprises a corresponding relationship between one of the M second registers and at least one of the N first registers; determining the index value in the timing sequence control signal; and determining the corresponding relationship between one of the M second registers and at least one of the N first registers according to the index value of the timing sequence control signal and the corresponding relationship between the index value and the preset corresponding relationship.

Optionally, the corresponding relationship between the N first registers and the M second registers is the corresponding relationship between the N first registers and at least a part of the M second registers.

Optionally, in the register corresponding relationship, each of the M second registers corresponds to at least one of the N first registers.

In a fourth aspect, there is provided a bridging chip in an embodiment of the present disclosure. The bridging chip comprises N first registers, M second registers and a controller, wherein the N first registers are configured to be electrically connected to an input end of a driver integrated circuit of a display panel, the M second registers are configured to be electrically connected to a device main board, the controller is configured to obtain a register corresponding relationship and write values in the M second registers into the corresponding N first registers according to the register corresponding relationship, the register corresponding relationship comprises a corresponding relationship between the N first registers and the M second registers, and M and N are both positive integers.

In an implementation of the embodiment of the present disclosure, the bridging chip further comprises a timing sequence control line, wherein the timing sequence control line is configured to obtain a timing sequence control signal, and the controller is configured to determine the corresponding relationship between the N first registers and the M second registers according to the timing sequence control signal.

In another implementation of the embodiment of the present disclosure, the timing sequence control signal is an inter-integrated circuit (I2C) bus signal.

In yet another implementation of the embodiment of the present disclosure, the input end of the driver integrated circuit comprises N input terminals, and the N input terminals and the N first registers are correspondingly connected one to one.

In still yet another implementation of the embodiment of the present disclosure, the controller is configured to obtain a timing sequence control signal, and determine the corresponding relationship between the N first registers and the M second registers according to the timing sequence control signal.

In still yet another implementation of the embodiment of the present disclosure, the controller is configured to obtain the corresponding relationship between an index value and a preset corresponding relationship, wherein the preset corresponding relationship comprises a corresponding relationship between one of the M second registers and at least one of the N first registers; determine the index value in the timing sequence control signal; and determine the corresponding relationship between one of the M second registers and at least one of the N first registers according to the index value of the timing sequence control signal and the corresponding relationship between the index value and the preset corresponding relationship.

DETAILED DESCRIPTION

To make the principle and advantages of the present disclosure clearer, the embodiments of the present disclosure will be described in further detail with reference to the accompanying drawings.

In the COF design, since many signals are received by the input end of a driver IC and are disordered in arrangement sequence, a printed circuit board (PCB) is required to be bonded on a flexible circuit board. The sequence of the signals is adjusted on the PCB, such that the sequence of the signals can achieve the requirements of a device main board connected to the driver IC. The manufacturing cost is increased since the PCB is increased and the bonding between the PCB and the flexible circuit board is performed. In addition, there are many pins of the driver IC, the width and interval of the pins are both smaller, and the PCB is provided with the pins corresponding to the pins of the driver IC. As a result, the difficulty of a bonding technology for the PCB and the flexible circuit board is larger.

Figure 1:
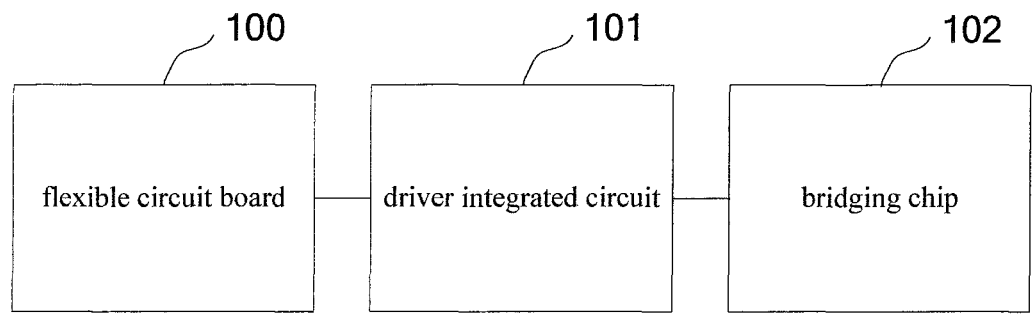
FIG. 1 is a structural block diagram of a COF circuit board provided by an embodiment of the present disclosure.

FIG. 1 is a structural block diagram of a COF circuit board provided by an embodiment of the present disclosure. Referring to FIG. 1, the COF circuit board comprises a flexible circuit board 100, a driver integrated circuit 101 and a bridging chip 102, wherein the driver integrated circuit 101 is electrically connected to the flexible circuit board 100 and the bridging chip 102 simultaneously.

Herein, the flexible circuit board 100 comprises a flexible substrate and a circuit structure disposed thereon. The flexible substrate may be a polyimide (PI) base material. The circuit structure is wires, for example copper wires, disposed on the PI base material.

Figure 2:
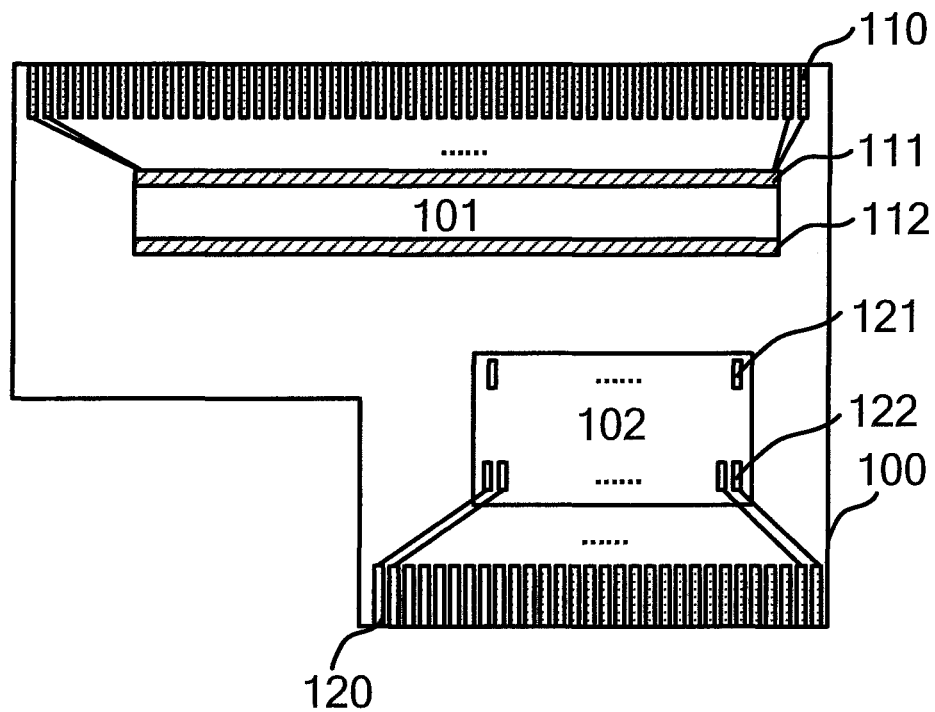
FIG. 2 is a structural schematic diagram of a COF circuit board provided by an embodiment of the present disclosure.

FIG. 2 is a structural schematic diagram of a COF circuit board provided by an embodiment of the present disclosure. Referring to FIG. 2, the driver integrated circuit 101 and the bridging chip 102 are disposed on the flexible circuit board 100. The flexible circuit board 100 is provided with a first connecting terminal 110 configured to be connected to a display panel and a second connecting terminal 120 configured to be connected to the device main board. An output end 111 of the driver integrated circuit 101 is electrically connected to the first connecting terminal 110. The bridging chip 102 comprises N first registers 121, M second registers 122 and a controller (not shown). The N first registers 121 are electrically connected to an input end 112 of the driver integrated circuit 101. The M second registers 122 are electrically connected to the second connecting terminal 120. The controller is configured to obtain a register corresponding relationship and write values in the second registers 122 into the corresponding first registers 121 according to the register corresponding relationship. The register corresponding relationship comprises a corresponding relationship between the N first registers 121 and the M second registers 122, and M and N are both positive integers.

Herein, the corresponding relationship between the N first registers 121 and the M second registers 122 has the following condition: each second register 122 has the corresponding first register 121, or only part of the second registers 122 has the corresponding first registers 121. Each second register 122 may correspond to one first register 121 and may also correspond to two or more first registers 121.

For example, when there exists the corresponding relationship that one second register 122 corresponds to two first registers 121, the value in such one second register 122 is written into the two corresponding first registers 121 simultaneously.

Herein, the device main board is the main board of an electronic device applied by the COF circuit board, and is, for example, a mobile phone main board, a television main board, a computer main board, etc. The device main board writes the signals into the display panel by the COF circuit board, to enable the display panel to display a corresponding picture.

According to the embodiment of the present disclosure, the flexible circuit board 100 is provided with the bridging chip, and signal processing is performed by the N first registers 121 and the M second registers 122 of the bridging chip. The controller in the bridging chip 102 writes the values in the second registers 122 into the corresponding first registers 121 according to the register corresponding relationship, such that the sequential arrangement of the signals is realized. Therefore, the arrangement sequence of the signals received by the input end 112 of the driver integrated circuit 101 can be adjusted by the bridging chip. Not only is the crossing of the wires caused by adjustment to the wires avoided, but also the adjustment by bonding the printed circuit board on the flexible circuit board 100 can be avoided. The manufacturing cost is reduced, and the difficulty of a manufacturing technology is reduced. In addition, the narrow frame design of products can be realized by adopting the COF design.

Figure 3:
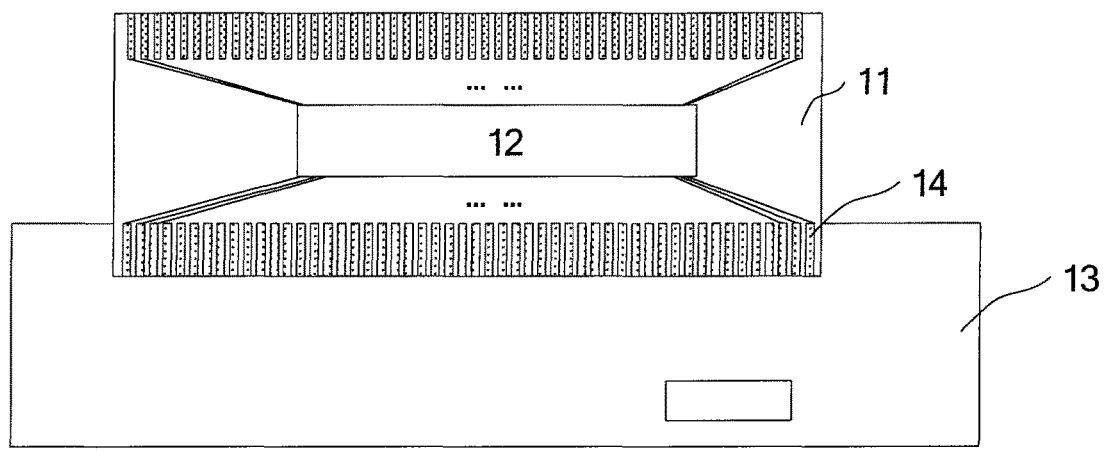
FIG. 3 is a structural schematic diagram of a COF circuit board provided by the related art.

The advantages of the COF circuit board provided by the embodiment of the present disclosure are explained in the following in combination with a structure of the COF circuit board in related technologies. FIG. 3 shows a structural schematic diagram of the COF circuit board in the related technologies. Referring to FIG. 3, the COF circuit board comprises a flexible circuit board 11, a driver integrated circuit 12 and a PCB 13. As shown in FIG. 3, many signals are received by an input end 14 of the driver integrated circuit 12 and are disordered in arrangement sequence. If adjustment is performed by the wires, then the condition of crossing of the wires is caused. Therefore, the PCB 13 is required to be bonded on the flexible circuit board 11, and the signal sequence is adjusted on the PCB 13, such that the signal sequence can achieve the requirements of the device main board. The manufacturing cost is increased since the PCB 13 is increased and the bonding between the PCB and the flexible circuit board 11 is performed. In addition, there are many pins on the PCB 13, and the width and interval of the pins are both smaller. As a result, the difficulty of a bonding technology for the PCB 13 and the flexible circuit board 11 is larger. However, the COF circuit board provided by the present disclosure is not required to be added with the PCB, such that not only is the cost reduced, but also the technological difficulty can be greatly reduced.

Referring to FIG. 2 again, the input end 112 of the driver integrated circuit 101 comprises N input terminals. The N input terminals and the N first registers 121 are correspondingly connected one to one, such that the values of the N first registers 121 in the bridging chip 102 are transmitted to the driver integrated circuit 101 for processing.

The output end 111 of the driver integrated circuit 101 comprises N output terminals. The first connecting terminal 110 comprises N pins. The N output terminals are correspondingly connected to the N pins one to one. Hence, the signals processed by the driver integrated circuit 101 can be transmitted to the display panel by the first connecting terminal 110, thereby driving the display panel to display a corresponding image.

In the embodiment of the present disclosure, M is larger than or equal to the amount of the connecting pins of the device main board. In other words, the amount of the second registers 122 is equal to that of the connecting pins of the device main board. Or the amount of the second registers 122 is larger than the amount of the connecting pins of the device main board. Hence, it can be guaranteed that the signal of each connecting pin of the device main board can be input into one independent second register for storage, thereby realizing signal processing of the device main board.

Optionally, in order to facilitate the connection between the bridging chip 102 and the driver integrated circuit 101 and the second connecting terminal 120, the bridging chip 120 further comprises N first pins and M second pins. The N first pins are connected to the N first registers 121 and the N input terminals simultaneously. The M second pins are connected to the M second registers 122 and the M terminals of the second connecting terminal 120 simultaneously.

In the embodiment of the present disclosure, the relation between N and M needs to be set according to actual needs. Exemplarily, N may be larger than M.

In the embodiment of the present disclosure, the bridging chip 102 further comprises a timing sequence control line. The timing sequence control line is configured to obtain a timing sequence control signal. The controller is configured to determine the corresponding relationship between the N first registers 121 and the M second registers 122 according to the timing sequence control signal. In such implementing manner, an external input instruction (the timing sequence control signal) is received by the timing sequence control line. The corresponding relationship between the first registers and the second registers is determined according to the external input instruction. The connecting sequence of the pins of the device main board and the second registers is fixed, and the connecting sequence of the first registers and the driver integrated circuit is fixed. Therefore, the determination of the corresponding relationship between the first registers and the second registers according to the externally input instruction is equivalent to the adjustment to the arrangement sequence of the pins of the device main board (each pin has fixed electrical properties). Hence, there is no need to bond the printed circuit board on the flexible circuit board 100. Meanwhile, in such manner, the COF circuit board can be suitable for different device main boards.

Exemplarily, the timing sequence control signal may adopt an inter-integrated circuit (I2C) timing sequence control signal.

Correspondingly, the above timing sequence control line may comprise the signal line, such as a volt current condenser (VCC) signal line, a ground (GND) signal line, a serial clock line (SCL) and a serial data line (SDA). The writing of the timing sequence control signal is finished by these signal lines together.

Exemplarily, when receiving different timing sequence control signals, the controller determines the corresponding relationship which is between the first registers and the second registers and contained by the timing sequence control signal, and executes the signal writing to the first registers from the second registers according to the corresponding relationship.

Further, the corresponding relationship between an index value and a preset corresponding relationship may be pre-stored in the controller. The preset corresponding relationship comprises a corresponding relationship between one second register and at least one first register. The index value in the timing sequence control signal is determined when the timing sequence control signal is received. The corresponding relationship between one second register and at least one first register is determined according to the index value of the timing sequence control signal and the corresponding relationship between the index value and the preset corresponding relationship.

For example, by taking the I2C bus signal as an example, the process of writing the corresponding relationship to the controller by an I2C bus is as follows.

An I2C bus host sends a start signal. The I2C bus host sends an address signal. The controller sends a response signal. The I2C bus host sends a data signal, needs to send the data signals in sequence when there are multiple data signals, and cannot send the next data signal till the controller sends the response to each data signal. After the data signals are completely sent, the I2C bus host stops sending the signals. In the embodiment of the present disclosure, the index value is carried in the data signal, that is, the data signal is the timing sequence control signal. When the index value of the timing sequence control signal is 0001, it is indicated that the second register numbered as I corresponds to the first register numbered as J. At this point, the controller writes the value in the second register numbered as I into the first register numbered as J. When the index value of the timing sequence control signal is 0011, it is indicated that the second register numbered as J corresponds to the first registers numbered as J and K. At this point, the controller writes the value in the second register numbered as J into the first registers numbered as J and K simultaneously.

Herein, the I2C bus host may write the corresponding relationship to the registers in the controller. The I2C bus host may be a control module of the display device.

Further, since the corresponding relationship obtained by the controller every time may only involve part of the first registers and second registers, the controller can also be configured to store the received corresponding relationship.

For example, the storage may be performed according to the sequence of the second registers, and the first registers corresponding to all second registers are recorded.

When the device main board connected on the COF circuit board is replaced, since the amount and definition of the pins (pinmap) of the device main board of different models are different, the corresponding relationship between the first registers and the second registers is also required to be changed therewith. At this point, the corresponding relationship needs to be updated. Or, when the pins of the device main board connected to the second registers have multiple functions and the data need to be written to different first registers at different moments, the corresponding relationship needs to be updated. For example, the I2C bus host sends the timing sequence control signal according to the model of the device main board. The controller updates the stored first registers corresponding to the second registers when the first registers corresponding to the second registers in the corresponding relationship in the received timing sequence control signal are different from the currently stored first registers, thereby storing the register corresponding relationship corresponding to the model of the current device main board. Therefore, the adaptation to the different device main boards is realized.

Since the corresponding relationship can be adjusted by the timing sequence control signal only, the sequence of the pins of the driver integrated circuit can be matched with the required sequence of the device main board. There is no need to redesign a circuit connecting structure. The design time is saved.

For example, when the second register numbered as a currently stored by the controller corresponds to the first register numbered as a, while the second register numbered as a in the corresponding relationship indicated by the timing sequence control signal corresponds to the first registers numbered as b and c, the numbers of the stores first registers corresponding to the second register numbered as a are changed as b and c. The updated corresponding relationship is adopted to perform data writing till the updating next time.

In the embodiment of the present disclosure, the second connecting terminal 120 comprises M terminals. The terminals may be pluggable terminals so as to be conveniently connected to the device main board. Exemplarily, the second connecting terminal 120 may be a zero insert force (ZIF) pluggable terminal. Therefore, the device main board is conveniently connected to the second connecting terminal 120.

The embodiment of the present disclosure also provides a display device, comprising the COF circuit mentioned as above.

Alternatively, the display device provided by the embodiment of the present disclosure may be any product or part having a display function, such as a mobile phone, a tablet computer, a television, a display, a laptop, a digital photo frame and a navigator.

According to the embodiment of the present disclosure, the flexible circuit board is provided with the bridging chip, and signal processing is performed by the N first registers and the M second registers of the bridging chip. The controller in the bridging chip writes the values in the second registers into the corresponding first registers according to the register corresponding relationship, such that the sequential arrangement of the signals is realized. Therefore, the arrangement sequence of the signals received by the input end of the driver integrated circuit can be adjusted by the bridging chip, to meet the requirements of the device main board connected to the driver integrated circuit. Since the bridging chip is directly disposed on the flexible circuit board, there is no need to bond the printed circuit board on the flexible circuit board. The manufacturing cost is reduced. Meanwhile, the difficulty of a manufacturing technology is reduced.

Figure 4:
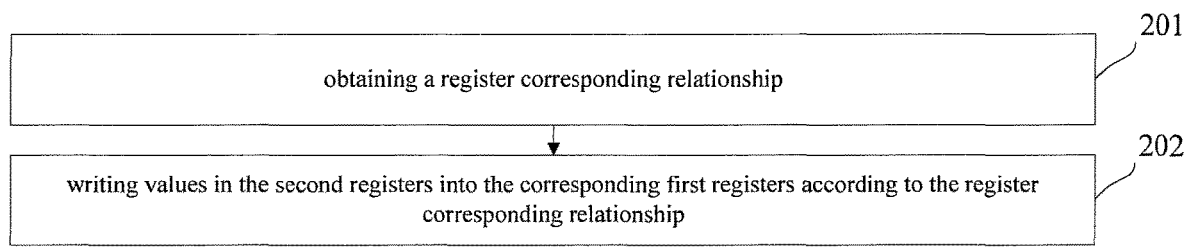
FIG. 4 is a flowchart of a signal processing method provided by an embodiment of the present disclosure.

FIG. 4 is a flowchart of a signal processing method provided by an embodiment of the present disclosure. The method is suitable for the display device mentioned as above, and may be executed by the controller mentioned as above. The method comprises the following steps.

In step 201: a register corresponding relationship is obtained. The register corresponding relationship comprises a corresponding relationship between the N first registers in a bridging chip and the M second registers, and M and N are both positive integers.

Herein, the register corresponding relationship may comprise all the first registers or only comprise part of the first registers, and may comprise all the second registers or only comprise part of the second registers. The corresponding relationship between the first registers and the second registers may be one to one, and may also be one to two or one to more. For example, when in the corresponding relationship, one second register corresponds to two first registers, the value of such one second register is written into the two corresponding first registers simultaneously.

In the embodiment of the present disclosure, obtaining a register corresponding relationship may comprise the following steps.

A timing sequence control signal is obtained. The corresponding relationship between the N first registers and the M second registers is determined according to the timing sequence control signal.

In the embodiment of the present disclosure, determining the corresponding relationship between the N first registers and the M second registers according to the timing sequence control signal may comprise the following steps.

The corresponding relationship between an index value and a preset corresponding relationship is obtained. The preset corresponding relationship comprises a corresponding relationship between one second register and at least one first register.

The index value in the timing sequence control signal is determined.

The corresponding relationship between one second register and at least one first register is determined according to the index value of the timing sequence control signal and the corresponding relationship between the index value and the preset corresponding relationship.

In the embodiment of the present disclosure, the timing sequence control signal may be an I2C bus signal.

Optionally, when receiving different timing sequence control signals, the controller determines the corresponding relationship between the first registers and the second registers contained by the timing sequence control signal, and executes the signal writing to the first registers from the second registers according to the corresponding relationship.

Further, the corresponding relationship which is between the first registers and the second registers and corresponds to the timing sequence control signals may be pre-stored in the controller. When the timing sequence control signal is received, the corresponding relationship between the first register and the second register is searched according to the timing sequence control signal.

For example, by taking the I2C bus signal as an example, the process of writing the corresponding relationship to the controller by an I2C bus is as follows.

An I2C bus host sends a start signal. The I2C bus host sends an address signal. The controller sends a response signal. The I2C bus host sends a data signal, needs to send the data signals in sequence when there are multiple data signals, and cannot send the next data signal till the controller sends the response to each data signal. After the data signals are completely sent, the I2C bus host stops sending the signals. In the embodiment of the present disclosure, the index value is carried in the data signal, that is, the data signal is the timing sequence control signal. When the index value of the timing sequence control signal is 0001, it is indicated that the second register numbered as I corresponds to the first register numbered as J. At this point, the controller writes the value in the second register numbered as I into the first register numbered as J. When the index value of the timing sequence control signal is 0011, it is indicated that the second register numbered as J corresponds to the first registers numbered as J and K. At this point, the controller writes the value in the second register numbered as J into the first registers numbered as J and K simultaneously.

Herein, the I2C bus host may write the corresponding relationship to the registers in the controller. The I2C bus host may be a control module of the display device, which is not limited by the present disclosure.

Further, since the corresponding relationship obtained by the controller every time may only involve part of the registers, the controller can also be configured to store the received corresponding relationship.

For example, the storage may be performed according to the sequence of the second registers, and the first registers corresponding to all second registers are recorded.

When the device main board connected on the COF circuit board is replaced, since the amount and definition of the pins (pinmap) of the device main board of different models are different, the corresponding relationship between the first registers and the second registers is also required to be changed therewith. At this point, the corresponding relationship needs to be updated. Or, when the pins of the device main board connected to the second registers have multiple functions and the data need to be written to different first registers at different moments, the corresponding relationship needs to be updated. For example, the I2C bus host sends the timing sequence control signal according to the model of the device main board. The controller updates the stored first registers corresponding to the second registers when the first registers corresponding to the second registers in the corresponding relationship in the received timing sequence control signal are different from the currently stored first registers, thereby storing the register corresponding relationship corresponding to the model of the current device main board. Therefore, the adaptation to the different device main boards is realized.

For example, when the second register numbered as a currently stored by the controller corresponds to the first register numbered as a, while the second register numbered as a in the corresponding relationship in the timing sequence control signal corresponds to the first registers numbered as b and c, the numbers of the stored first registers corresponding to the second register numbered as a are changed as b and c. The updated corresponding relationship is adopted to perform data writing till the updating next time.

In step 202: values in the second registers are written into the corresponding first registers according to the register corresponding relationship, For example, if the first register numbered as I corresponds to the second register numbered as J, then the value in the second register numbered as J is written into the first register numbered as I.

According to the embodiment of the present disclosure, the flexible circuit board is provided with the bridging chip, and signal processing is performed by the N first registers and the M second registers of the bridging chip. The controller in the bridging chip writes the values in the second registers into the corresponding first registers according to the register corresponding relationship, such that the sequential arrangement of the signals is realized. Therefore, the arrangement sequence of the signals received by the input end of the driver integrated circuit can be adjusted by the bridging chip, to meet the requirements of the device main board connected to the driver integrated circuit. Since the bridging chip is directly disposed on the flexible circuit board, there is no need to bond the printed circuit board on the flexible circuit board. The manufacturing cost is reduced, and meanwhile, the difficulty of a manufacturing technology is reduced.

The foregoing are only illustrative embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A COF circuit board, comprising a flexible circuit board, a driver integrated circuit and a bridging chip, wherein the driver integrated circuit and the bridging chip are disposed on the flexible circuit board, the bridging chip is located outside the driver integrated circuit, the flexible circuit board is provided with a first connecting terminal configured to be connected to a display panel and a second connecting terminal configured to be connected to a device main board, and an output end of the driver integrated circuit is electrically connected to the first connecting terminal; and the bridging chip comprises N first registers, M second registers and a controller, the N first registers are electrically connected to an input end of the driver integrated circuit, the M second registers are electrically connected to the second connecting terminal, the controller is configured to obtain a register corresponding relationship and write values in the M second registers into the corresponding N first registers according to the register corresponding relationship, the register corresponding relationship comprises a corresponding relationship between the N first registers and the M second registers, and M and N are both positive integers;

wherein when there exists the corresponding relationship that one second register corresponds to two or more first registers, the value in such one second register is written into the two or more corresponding first registers simultaneously.

2. The COF circuit board according to claim 1, wherein the bridging chip further comprises a timing sequence control line, the timing sequence control line is configured to obtain a timing sequence control signal, and the controller is configured to determine the corresponding relationship between the N first registers and the M second registers according to the timing sequence control signal.

3. The COF circuit board according to claim 1, wherein the corresponding relationship between the N first registers and the M second registers is the corresponding relationship between the N first registers and at least part of the M second registers.

4. The COF circuit board according to claim 1, wherein in the register corresponding relationship, each of the M second registers corresponds to at least one of the N first registers.

5. The COF circuit board according to claim 1, wherein the second connecting terminal is a zero insert force (ZIF) pluggable terminal.

6. The COF circuit board according to claim 1, wherein the input end of the driver integrated circuit comprises N input terminals, and the N input terminals and the N first registers are correspondingly connected one to one.

7. A display device, comprising the COF circuit board according to claim 1 and further comprising a display panel, wherein the first connecting terminal is connected to the display panel.

8. A signal processing method, comprising:
obtaining a register corresponding relationship, wherein the register corresponding relationship comprises a corresponding relationship between N first registers in a bridging chip and M second registers in the bridging chip, and M and N are both positive integers; and
writing values in the M second registers into the corresponding N first registers according to the register corresponding relationship,
wherein the N first registers are electrically connected to an input end of a driver integrated circuit disposed on a flexible circuit board included by a display device, the bridging chip is located outside the driver integrated circuit, the driver integrated circuit and the bridging chip are disposed on the flexible circuit board, an output end of the driver integrated circuit is electrically connected to a first connecting terminal configured to be connected to a display panel and disposed on the flexible circuit board, and the M second registers are electrically connected to a second connecting terminal configured to be connected to a device main board and disposed on the flexible circuit board;
wherein when there exists the corresponding relationship that one second register corresponds to two or more first registers, the value in such one second register is written into the two or more corresponding first registers simultaneously.

9. The method according to claim 8, wherein obtaining a register corresponding relationship comprises:
obtaining a timing sequence control signal; and
determining the corresponding relationship between the N first registers and the M second registers according to the timing sequence control signal.

10. The method according to claim 9, wherein determining the corresponding relationship between the N first registers and the M second registers according to the timing sequence control signal comprises:
obtaining a corresponding relationship between an index value and a preset corresponding relationship, wherein the preset corresponding relationship comprises a corresponding relationship between one of the M second registers and at least one of the N first registers;
determining the index value in the timing sequence control signal; and
determining the corresponding relationship between one of the M second registers and at least one of the N first registers according to the index value of the timing sequence control signal and the corresponding relationship between the index value and the preset corresponding relationship.

11. The method according to claim 8, wherein the corresponding relationship between the N first registers and the M second registers is the corresponding relationship between the N first registers and at least part of the M second registers.

12. The method according to claim 8, wherein in the register corresponding relationship, each of the M second registers corresponds to at least one of the N first registers.

13. A bridging chip, comprising N first registers, M second registers and a controller, wherein the N first registers are configured to be electrically connected to an input end of a driver integrated circuit of a display panel, the bridging chip is located outside the driver integrated circuit, the driver integrated circuit and the bridging chip are disposed on a flexible circuit board, the M second registers are configured to be electrically connected to a device main board, the controller is configured to obtain a register corresponding relationship and write values in the M second registers into the corresponding N first registers according to the register corresponding relationship, the register corresponding relationship comprises a corresponding relationship between the N first registers and the M second registers, and M and N are both positive integers;
wherein when there exists the corresponding relationship that one second register corresponds to two first registers, the value in such one second register is written into the two or more corresponding first registers simultaneously.

14. The bridging chip according to claim 13, further comprising a timing sequence control line, wherein the timing sequence control line is configured to obtain a timing sequence control signal, and the controller is configured to determine the corresponding relationship between the N first registers and the M second registers according to the timing sequence control signal.

15. The bridging chip according to claim 13, wherein the input end of the driver integrated circuit comprises N input terminals, and the N input terminals and the N first registers are correspondingly connected one to one.

16. The bridging chip according to claim 13, wherein the controller is configured to: obtain a timing sequence control signal; and determine the corresponding relationship between the N first registers and the M second registers according to the timing sequence control signal.

17. The bridging chip according to claim 16, wherein the controller is configured to: obtain a corresponding relationship between an index value and a preset corresponding relationship, wherein the preset corresponding relationship comprises a corresponding relationship between one of the M second registers and at least one of the N first registers; determine the index value in the timing sequence control signal; and determine the corresponding relationship between one of the M second registers and at least one of the N first register according to the index value of the timing sequence control signal and the corresponding relationship between the index value and the preset corresponding relationship.

* * * * *